United States Patent
Takeshita et al.

(10) Patent No.: US 10,622,965 B2
(45) Date of Patent: Apr. 14, 2020

(54) SURFACE ACOUSTIC WAVE DEVICE ASSEMBLY

(71) Applicant: Murata Manufacturing Co., Ltd., Nagaokakyo-shi, Kyoto-fu (JP)

(72) Inventors: Toru Takeshita, Nagaokakyo (JP); Seiji Kai, Nagaokakyo (JP); Takashi Naka, Nagaokakyo (JP); Motoji Tsuda, Nagaokakyo (JP); Mitsuyoshi Hira, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 449 days.

(21) Appl. No.: 15/651,036

(22) Filed: Jul. 17, 2017

(65) Prior Publication Data

US 2017/0317659 A1 Nov. 2, 2017

Related U.S. Application Data

(63) Continuation of application No. PCT/JP2016/052952, filed on Feb. 1, 2016.

(30) Foreign Application Priority Data

Feb. 3, 2015 (JP) ................... 2015-019603

(51) Int. Cl.
*H03H 9/05* (2006.01)
*H01H 9/10* (2006.01)
(Continued)

(52) U.S. Cl.
CPC .............. *H03H 9/059* (2013.01); *H03H 3/08* (2013.01); *H03H 9/0009* (2013.01);
(Continued)

(58) Field of Classification Search
CPC .... H03H 9/059; H03H 9/0009; H03H 9/1071; H03H 9/1092
(Continued)

(56) References Cited

U.S. PATENT DOCUMENTS

| 2006/0087336 A1 | 4/2006 | Shintaku |
| 2008/0179991 A1 | 7/2008 | Ishiura et al. |

(Continued)

FOREIGN PATENT DOCUMENTS

| JP | 2000-040932 A | 2/2000 |
| JP | 2002-232254 A | 8/2002 |

(Continued)

OTHER PUBLICATIONS

Official Communication issued in International Patent Application No. PCT/JP2016/052952, dated Apr. 26, 2016.

*Primary Examiner* — Derek J Rosenau
(74) *Attorney, Agent, or Firm* — Keating & Bennett, LLP (57) ABSTRACT

A surface acoustic wave device assembly includes a collective board, first circuit portions provided on the collective board and respectively including first hot terminals and first ground terminals, a second circuit portion provided on the collective board and including second hot terminals and second ground terminals, and a power supply wiring provided on the collective board so as to surround the periphery of the first circuit portions and the second circuit portion. The first circuit portions include surface acoustic wave devices defining band pass filters. The second circuit portion defines a band pass filter. The first ground terminals and first hot terminals, and the second ground terminal are connected to the power supply wiring, the second hot terminals are not connected to the power supply wiring, and pass bands of the (Continued)

surface acoustic wave devices and a pass band of the band pass filter defined by the second circuit portion are the same or substantially the same.

20 Claims, 9 Drawing Sheets (51) Int. Cl.
    *H03H 3/08*        (2006.01)
    *H03H 9/145*      (2006.01)
    *H03H 9/00*       (2006.01)
    *H03H 9/10*       (2006.01)
    *H03H 3/007*      (2006.01)

(52) U.S. Cl.
    CPC ........ *H03H 9/1071* (2013.01); *H03H 9/1092* (2013.01); *H03H 9/145* (2013.01); *H03H 2003/0071* (2013.01)

(58) Field of Classification Search
    USPC ...... 310/313 R, 313 A, 313 B, 313 C, 313 D
    See application file for complete search history.

(56) References Cited

U.S. PATENT DOCUMENTS

| 2009/0212399 | A1  | 8/2009  | Kaneda et al. |         |
|--------------|-----|---------|---------------|---------|
| 2011/0068656 | A1* | 3/2011  | Lee ............... | G01N 29/022 |
|              |     |         |               | 310/313 C |
| 2012/0200371 | A1* | 8/2012  | Yamashita ...........  | H03H 3/08 |
|              |     |         |               | 333/133 |
| 2013/0214640 | A1  | 8/2013  | Yamazaki      |         |

FOREIGN PATENT DOCUMENTS

| JP | 2006-120962 A | 5/2006  |
| JP | 2007-028195 A | 2/2007  |
| JP | 2008-028199 A | 2/2008  |
| JP | 2009-206183 A | 9/2009  |
| WO | 2007/125724 A1 | 11/2007 |
| WO | 2012/050016 A1 | 4/2012  |

\* cited by examiner

SURFACE ACOUSTIC WAVE DEVICE ASSEMBLY

CROSS REFERENCE TO RELATED APPLICATIONS

This application claims the benefit of priority to Japanese Patent Application No. 2015-019603 filed on Feb. 3, 2015 and is a Continuation Application of PCT Application No. PCT/JP2016/052952 filed on Feb. 1, 2016. The entire contents of each application are hereby incorporated herein by reference.

BACKGROUND OF THE INVENTION

1. Field of the Invention

The present invention relates to a surface acoustic wave device assembly related to a surface acoustic wave device.

2. Description of the Related Art

In recent years, surface acoustic wave devices having a WLP structure have been widely used for a cellular phone and the like.

For example, the International Publication No. 2012/050016 discloses a surface acoustic wave device having a WLP structure. In the surface acoustic wave device in International Publication No. 2012/050016, under-bump metals are connected to respective wirings on a piezoelectric substrate. All of the under-bump metals are formed by an electrolytic plating method. That is to say, all of the above-described wirings are connected to a power supply wiring for the electrolytic plating method when the under-bump metals are formed.

However, in the surface acoustic wave device in International Publication No. 2012/050016, all of the above-described wirings are connected to the power supply wiring. Therefore, ground terminals and hot terminals are electrically short-circuited. For this reason, electrical characteristics of the surface acoustic wave device cannot be examined and non-defective products and defective products cannot be sorted before being cut into individual surface acoustic wave devices with a dicing machine.

SUMMARY OF THE INVENTION

Preferred embodiments of the present invention provide surface acoustic wave device assemblies enabling non-defective products and defective products to be sorted before the surface acoustic wave device assemblies are divided into individual surface acoustic wave devices.

A surface acoustic wave device assembly according to a preferred embodiment of the present invention includes a collective board that is defined by a piezoelectric body; a plurality of first circuit portions that are provided on the collective board and respectively include interdigital transducer (IDT) electrodes, and first hot terminals and first ground terminals connected to the IDT electrodes; a second circuit portion that is provided on the collective board and includes a functional electrode, and a second hot terminal and a second ground terminal connected to the functional electrode; and a power supply wiring that is provided on the collective board so as to surround the periphery of the plurality of first circuit portions and the second circuit portion; wherein the respective first circuit portions define surface acoustic wave devices as band pass filters and the second circuit portion defines a band pass filter; the plurality of first ground terminals and the plurality of first hot terminals are connected to the power supply wiring, the second ground terminal is connected to the power supply wiring, and the second hot terminal is not connected to the power supply wiring; and pass bands of the respective surface acoustic wave devices and a pass band of the band pass filter defined by the second circuit portion are the same or substantially the same.

A surface acoustic wave device assembly according to a preferred embodiment of the present invention includes a collective board that is defined by a piezoelectric body; a plurality of first circuit portions that are provided on the collective board and respectively include IDT electrodes, and first hot terminals and first ground terminals connected to the IDT electrodes; a second circuit portion that is provided on the collective board and includes a functional electrode, and a second hot terminal and a second ground terminal connected to the functional electrode; and a power supply wiring that is provided on the collective board so as to surround the periphery of the plurality of first circuit portions and the second circuit portion; wherein the respective first circuit portions define surface acoustic wave devices; the plurality of first ground terminals and the plurality of first hot terminals are connected to the power supply wiring, the second ground terminal is connected to the power supply wiring, and the second hot terminal is not connected to the power supply wiring; and electric circuit configurations of the plurality of first circuit portions and an electric circuit configuration of the second circuit portion are the same or substantially the same.

A surface acoustic wave device assembly according to a preferred embodiment of the present invention preferably further includes a plurality of first support members that are provided on the collective board and respectively include first cavities to which the respective first circuit portions are exposed; a second support member that is provided on the collective board and includes a second cavity to which the second circuit portion is exposed; and a lid that is provided on the plurality of first support members and the second support member so as to seal the plurality of first cavities and the second cavity; wherein the plurality of first support members overlap with the plurality of first hot terminals and the plurality of first ground terminals when seen from above, and the second support member overlaps with the second hot terminal and the second ground terminal when seen from above; and a plurality of first through-holes and a plurality of second through-holes pass through the first support members and the lid and expose the plurality of first hot terminals and the plurality of first ground terminals, and a third through-hole and a fourth through-hole pass through the second support member and the lid and expose the second hot terminal and the second ground terminal.

A surface acoustic wave device assembly according to a preferred embodiment of the present invention preferably further includes first under-bump metal layers that are respectively provided in the plurality of first through-holes, second under-bump metal layers that are respectively provided in the plurality of second through-holes, and a fourth under-bump metal layer that is provided in the fourth through-hole. In this case, bumps are able to be provided on the first, second, and fourth under-bump metal layers. Therefore, a surface acoustic wave device is able to be mounted on a mounting substrate or other suitable substrate with the bumps interposed therebetween.

In a surface acoustic wave device assembly according to a preferred embodiment of the present invention, preferably no under-bump metal layer is provided in the third through-hole. In this case, no bump is able to be provided in the third through-hole. By contrast, bumps are able to be provided on the first, second, and fourth under-bump metal layers provided on the first, second, and fourth through-holes, respectively. When the bumps are provided on the first, second, and fourth under-bump metal layers, the plurality of first circuit portions and the second circuit portion are able to be easily distinguished from each other when seen from above.

A surface acoustic wave device assembly according to a preferred embodiment of the present invention preferably further includes a third under-bump metal layer that is provided in the third through-hole, wherein thicknesses of the respective first under-bump metal layers are larger than a thickness of the third under-bump metal layer. In this case, when the bumps are provided on the first to fourth under-bump metal layers, planar shapes of the bumps provided on the first under-bump metal layers and a planar shape of the bump provided on the third under-bump metal layer are able to be made different from each other. Therefore, the plurality of first circuit portions and the second circuit portion are able to be easily distinguished from each other when seen from above.

A surface acoustic wave device assembly according to a preferred embodiment of the present invention preferably further includes a plurality of first bumps that are provided on the respective first under-bump metal layers, a plurality of second bumps that are provided on the respective second under-bump metal layers, a third bump that is provided at a position overlapping with the third through-hole when seen from above, and a fourth bump that is provided on the fourth under-bump metal layer, wherein diameters of inscribed circles that are inscribed in the respective first bumps are larger than a diameter of an inscribed circle that is inscribed in the third bump when seen from above. In this case, the plurality of first circuit portions and the second circuit portion are able to be easily distinguished from each other when seen from above.

In a surface acoustic wave device assembly according to a preferred embodiment of the present invention, preferably, planar shapes of the first cavities of the respective first support members and a planar shape of the second cavity of the second support member are the same or substantially the same. In this case, a manufacturing process of the surface acoustic wave device assembly is simplified.

In a surface acoustic wave device assembly according to a preferred embodiment of the present invention, preferably, a great number of second ground terminals than the second hot terminal are provided. In this case, a posture when the collective board is grounded to divide the surface acoustic wave device assembly into individual surface acoustic wave devices is able to be stabilized. Therefore, flatness of individual piezoelectric substrates formed by dividing the collective board is effectively improved and variations in the thickness among the piezoelectric substrates are effectively reduced.

In a surface acoustic wave device assembly according to a preferred embodiment of the present invention, preferably, an arrangement of the first and second through-holes in the respective first support members and an arrangement of the third and fourth through-holes in the second support member are the same or substantially the same. In this case, the manufacturing process of the surface acoustic wave device assembly is further simplified.

In a surface acoustic wave device assembly according to a preferred embodiment of the present invention, preferably, the functional electrode of the second circuit portion is an IDT electrode having the same or substantially the same configuration as the IDT electrodes of the plurality of first circuit portions, and the plurality of first circuit portions and the second circuit portion have the same or substantially the same electrical circuit configuration and physical configuration. In this case, the manufacturing process of the surface acoustic wave device assembly is further simplified. Furthermore, non-defective products and defective products are able to be sorted based on desired characteristics by examining the second circuit portion.

Preferred embodiments of the present invention provide surface acoustic wave device assemblies that enable non-defective products and defective products to be sorted before the surface acoustic wave device assembly is divided into individual surface acoustic wave devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by explaining specific preferred embodiments of the present invention with reference to the accompanying drawings.

It should be noted that the respective preferred embodiments described in the specification are examples and partial replacements or combinations of configurations can be made among the different preferred embodiments.

Figure 1:
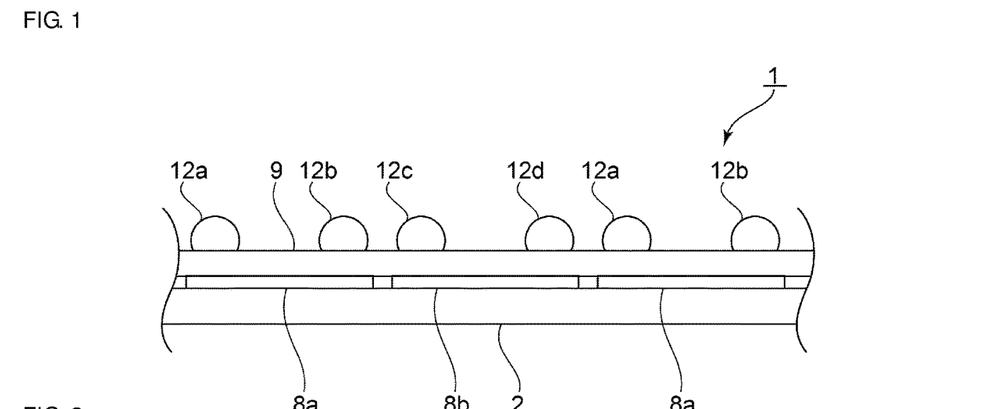
FIG. 1 is a partial front view of a surface acoustic wave device assembly according to a first preferred embodiment of the present invention.
Figure 2:
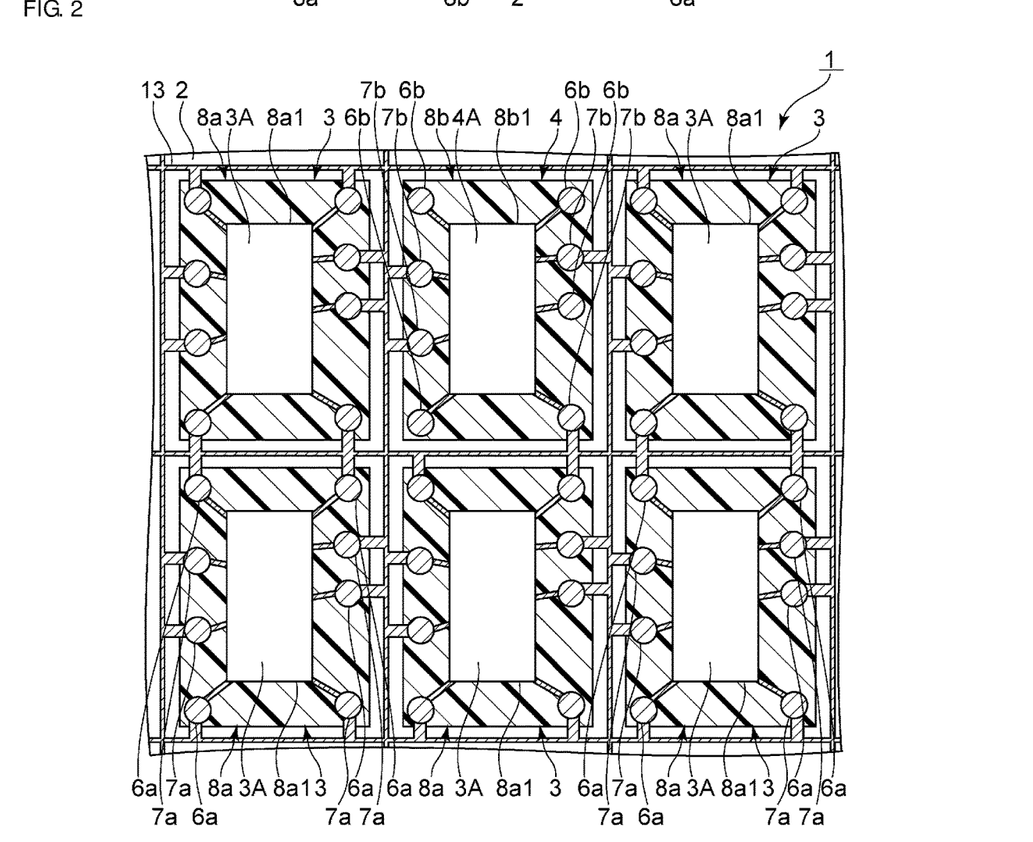
FIG. 2 is a partial plan cross-sectional view of the surface acoustic wave device assembly according to the first preferred embodiment of the present invention.

FIG. 1 is a partial front view of a surface acoustic wave device assembly according to a first preferred embodiment of the present invention. FIG. 2 is a partial plan cross-sectional view of the surface acoustic wave device assembly in the first preferred embodiment of the present invention.

A surface acoustic wave device assembly 1 includes a collective board 2. The collective board 2 is preferably a LiTaO3 substrate having a cut-angle of 42°, for example. It should be noted that the collective board 2 is not limited to the above-described piezoelectric body and may be made of a piezoelectric single crystal, such as $LiNbO_3$ or appropriate piezoelectric ceramics.

The surface acoustic wave device assembly 1 includes a plurality of first circuit portions 3A provided on the collective board 2. The respective first circuit portions 3A are surface acoustic wave devices 3 defining band pass filters. The surface acoustic wave device assembly 1 also includes a second circuit portion 4A provided on the collective board 2. The second circuit portion 4A is an evaluation element 4 defining a band pass filter. In the present preferred embodiment, the evaluation element 4 is preferably also a surface acoustic wave device.

In the present preferred embodiment, the respective first circuit portions 3A and the second circuit portion 4A preferably have the same or substantially the same electrical circuit configuration and physical configuration. That is to say, the arrangement and materials of respective elements and wirings which define the surface acoustic wave devices 3 and the arrangement and materials of respective elements and wirings which define the evaluation element 4 are preferably the same or substantially the same. Therefore, pass bands of the respective surface acoustic wave devices 3 and a pass band of the evaluation element 4 are preferably the same or substantially the same.

A power supply wiring 13 is provided on the collective board 2 so as to surround the respective surface acoustic wave devices 3 and the evaluation element 4. The power supply wiring 13 is provided along dicing lines along which the surface acoustic wave device assembly 1 is divided into individual surface acoustic wave devices. It should be noted that the power supply wiring 13 is a wiring that defines under-bump metal layers, which will be described later, preferably formed by an electrolytic plating method.

The respective surface acoustic wave devices 3 include first support members 8a that are provided on the collective board 2 so as to respectively surround the first circuit portions 3A. The respective first circuit portions 3A are exposed to first cavities 8a1 of the respective first support members 8a. The evaluation element 4 includes a second support member 8b that is provided on the collective board 2 so as to surround the second circuit portion 4A. The second circuit portion 4A is exposed to a second cavity 8b1 of the second support member 8b. The plurality of first support members 8a and the second support member 8b are preferably made of resin or other suitable material, for example.

The respective surface acoustic wave devices 3 include a plurality of first hot terminals 6a and a plurality of first ground terminals 7a that are provided on the collective board 2. The first hot terminals 6a and the first ground terminals 7a are connected to the power supply wiring 13. The evaluation element 4 includes a plurality of second hot terminals 6b and a plurality of second ground terminals 7b that are provided on the collective board 2. The second ground terminals 7b are connected to the power supply wiring 13. On the other hand, the second hot terminals 6b are not connected to the power supply wiring 13.

Positions of the first hot terminals 6a in the respective surface acoustic wave devices 3 and positions of the second hot terminals 6b in the evaluation element 4 are preferably the same or substantially the same. Positions of the first ground terminals 7a in the respective surface acoustic wave devices 3 and positions of the second ground terminals 7b in the evaluation element 4 are preferably the same or substantially the same.

Figure 3:
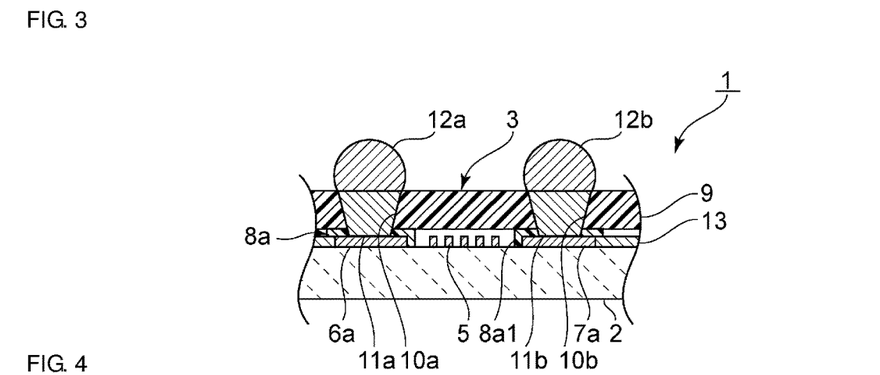
FIG. 3 is a front cross-sectional view of a surface acoustic wave device in the first preferred embodiment of the present invention.

FIG. 3 is a front cross-sectional view of the surface acoustic wave device in the first preferred embodiment of the present invention.

The surface acoustic wave devices 3 include IDT electrodes 5 provided on the collective board 2. The first circuit portions 3A illustrated in FIG. 2 include the plurality of IDT electrodes. Although not illustrated in the drawings, the IDT electrodes 5 are connected to the first hot terminals 6a and the first ground terminals 7a. The first support members 8a are provided on the collective board 2 so as to cover the first hot terminals 6a and the first ground terminals 7a. A lid 9 is provided so as to seal the first cavities 8a1 of the first support members 8a. The lid 9 is preferably made of resin or other suitable material, for example.

First and second through-holes 10a and 10b pass through the lid 9 and the first support members 8a. One end of each of the first through-holes 10a extends to the first hot terminals 6a. One end of each of the second through-holes 10b extends to the first ground terminals 7a. First under-bump metal layers 11a are provided in the first through-holes 10a. Second under-bump metal layers 11b are provided in the second through-holes 10b. First bumps 12a are provided on the first under-bump metal layers 11a. Second bumps 12b are provided on the second under-bump metal layers 11b. The first under-bump metal layers 11a connect the first hot terminals 6a and the first bumps 12a. The second under-bump metal layers 11b connect the first ground terminals 7a and the second bumps 12b. The first and second bumps 12a and 12b are preferably made of appropriate brazing filler metal, such as solder, for example.

Although not illustrated in the drawings, the plurality of first through-holes and the plurality of first under-bump metal layers are provided so as to be respectively connected to the plurality of first hot terminals. The plurality of second through-holes and the plurality of second under-bump metal layers are provided so as to be respectively connected to the plurality of first ground terminals.

Figure 4:
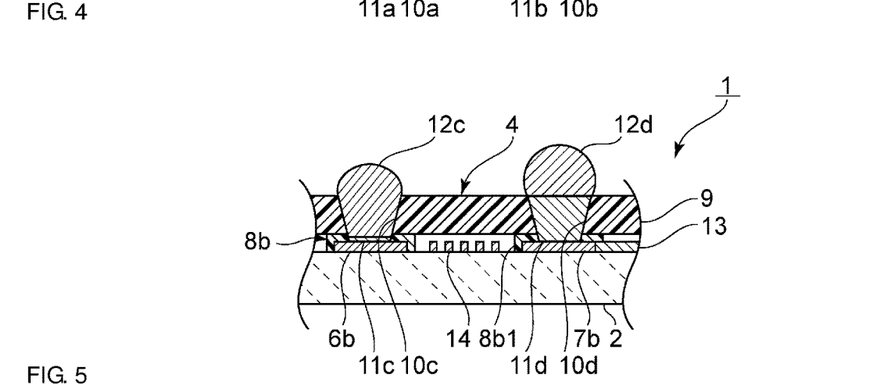
FIG. 4 is a front cross-sectional view of an evaluation element in the first preferred embodiment of the present invention.

FIG. 4 is a front cross-sectional view of the evaluation element in the first preferred embodiment of the present invention.

The evaluation element 4 includes functional electrodes 14 provided on the collective board 2. The second circuit portion 4A illustrated in FIG. 2 includes the functional electrodes 14. In the present preferred embodiment, the evaluation element 4 has an electrical circuit configuration that is preferably the same or substantially the same as that of the surface acoustic wave devices 3. The functional electrodes 14 are IDT electrodes similar to the IDT electrodes 5 in the surface acoustic wave devices 3 illustrated in FIG. 3.

Although not illustrated in the drawings, the functional electrodes 14 are connected to the second hot terminals 6b and the second ground terminals 7b. The second support member 8b is provided on the collective board 2 so as to cover the second hot terminals 6b and the second ground terminals 7b. The lid 9 is provided so as to seal the second cavity 8b1 of the second support member 8b.

Third and fourth through-holes 10c and 10d pass through the lid 9 and the second support member 8b. First ends of the third through-holes 10c extend to the second hot terminals 6b. First ends of the fourth through-holes 10d extend to the second ground terminals 7b. The arrangement of the first through-holes 10a and the second through-holes 10b in the first support members 8a illustrated in FIG. 3 and the arrangement of the third through-holes 10c and the fourth through-holes 10d in the second support member 8b are preferably the same or substantially the same.

Third under-bump metal layers 11c are provided in the third through-holes 10c. Fourth under-bump metal layers 11d are provided in the fourth through-holes 10d. The thicknesses of the fourth under-bump metal layers 11d are preferably larger than the thicknesses of the third under-bump metal layers 11c. The thicknesses of the first and second under-bump metal layers 11a and 11b illustrated in FIG. 3 are also preferably larger than the thicknesses of the third under-bump metal layers 11c. It should be noted that the third under-bump metal layers 11c may not be provided.

Third bumps 12c are provided on the third under-bump metal layers 11c. Fourth bumps 12d are provided on the fourth under-bump metal layers 11d. The third under-bump metal layers 11c connect the second hot terminals 6b and the third bumps 12c. The fourth under-bump metal layers 11d connect the second ground terminals 7b and the fourth bumps 12d. The third and fourth bumps 12c and 12d are preferably made of appropriate brazing filler metal, such as solder, for example.

It is sufficient that the third bumps 12c are provided at positions overlapping with the third through-holes 10c when seen from above. The third bumps 12c and the third under-bump metal layers 11c may not be connected to each other.

Although not illustrated in the drawings, the plurality of third through-holes and the plurality of third under-bump metal layers are provided so as to be respectively connected to the plurality of second hot terminals. The plurality of fourth through-holes and the plurality of fourth under-bump metal layers are provided so as to be respectively connected to the plurality of second ground terminals.

In the present preferred embodiment, the surface acoustic wave device assembly 1 includes the evaluation element 4 and the second hot terminals 6b of the evaluation element 4 are not connected to the power supply wiring 13. According to the present preferred embodiment, non-defective products and defective products are able to be sorted before the surface acoustic wave device assembly 1 is divided into individual surface acoustic wave devices. This will be described hereinafter.

In the present preferred embodiment, the first circuit portions 3A of the plurality of surface acoustic wave devices 3 and the second circuit portion 4A of the evaluation element 4 preferably have the same or substantially the same electrical circuit configuration and physical configuration. Therefore, the plurality of surface acoustic wave devices 3 on the same collective board 2 have substantially the same electrical characteristics as those of the evaluation element 4 on the same collective board 2. Accordingly, when electric characteristics of the evaluation element 4, such as filter characteristics, are examined and it is determined that the evaluation element 4 does not satisfy the performance as a non-defective product, it is determined that the plurality of surface acoustic wave devices 3 on the same collective board 2 also do not satisfy the performance as the non-defective products.

It is preferable that the evaluation element 4 and the plurality of surface acoustic wave devices 3 have the same or substantially the same electrical circuit configuration and physical configuration as in the preferred embodiment. With this configuration, the non-defective products are able to be reliably sorted.

It is sufficient that the electrical characteristics of the evaluation element 4 are examined, for example, after the second circuit portion 4A is provided and before the second support member 8b is provided. With this examination, the non-defective products and the defective products are able to be sorted before the surface acoustic wave device assembly 1 is divided into the individual surface acoustic wave devices 3. Accordingly, only the plurality of surface acoustic wave devices 3 that have been determined as the non-defective products are subjected to subsequent processes, so as to reduce the cost.

As illustrated in FIG. 4, the second hot terminals 6b of the evaluation element 4 are not connected to the power supply wiring 13. Therefore, the third under-bump metal layers 11c are not sufficiently formed when the first to fourth under-bump metal layers 11a to 11d illustrated in FIG. 3 and FIG. 4 are formed by the electrolytic plating method. For this reason, the thicknesses of the third under-bump metal layers 11c are smaller than the thicknesses of the first, second, and fourth under-bump metal layers 11a, 11b, and 11d. The first, second, and fourth bumps 12a, 12b, and 12d are provided on the first, second, and fourth under-bump metal layers 11a, 11b, and 11d having the large thicknesses, respectively. Therefore, the first, second, and fourth bumps 12a, 12b, and 12d do not enter the first, second, and fourth through-holes 10a, 10b, and 10d, respectively, to a large extent. By contrast, the third bumps 12c provided on the third under-bump metal layers 11c having the small thicknesses largely enter the third through-holes 10c.

Figure 5:
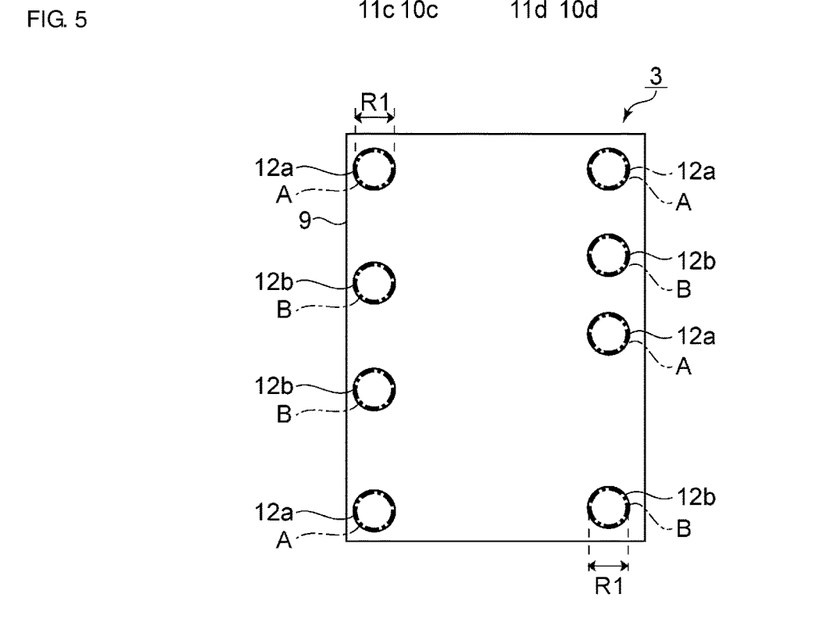
FIG. 5 is a plan view of the surface acoustic wave device in the first preferred embodiment of the present invention.
Figure 6:
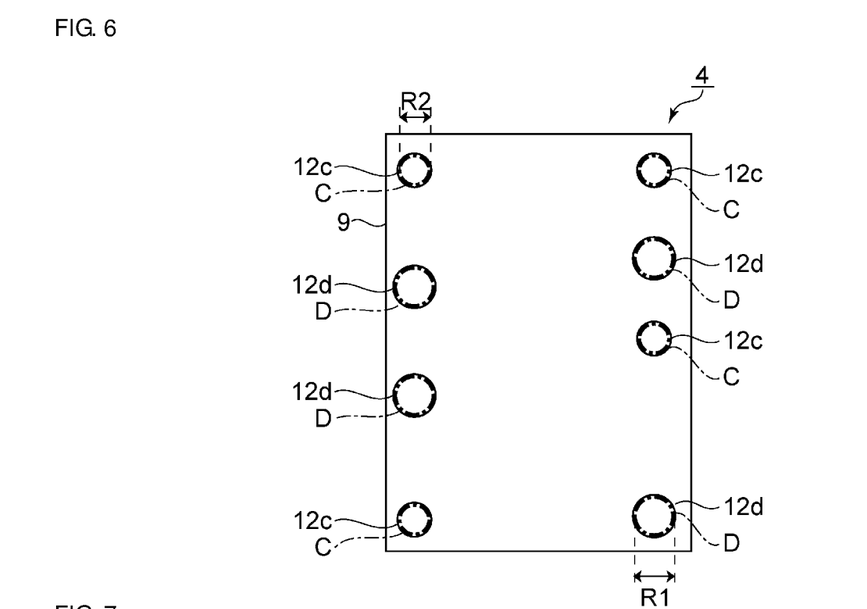
FIG. 6 is a plan view of the evaluation element in the first preferred embodiment of the present invention.

FIG. 5 is a plan view of the surface acoustic wave device in the first preferred embodiment of the present invention. FIG. 6 is a plan view of the evaluation element in the first preferred embodiment.

Inscribed circles that are inscribed in the first to fourth bumps 12a to 12d are assumed to be inscribed circles A to D, respectively. Diameters R2 of the inscribed circles C are preferably smaller than diameters R1 of the inscribed circles A, B, and D because only the third bumps 12c largely enter the third through-holes 10c. Thus, the plurality of surface acoustic wave devices 3 and the evaluation element 4 are able to be easily distinguished from each other when seen from above based on the difference between the diameters R2 of the inscribed circles C and the diameters R1 of the inscribed circles A, B, and D. Therefore, only the evaluation element 4 is able to be easily removed after the division into the individual surface acoustic wave devices 3. To be more specific, for example, in a process of transporting the individual surface acoustic wave devices 3, only the surface acoustic wave devices 3 is able to be transported after the surface acoustic wave devices 3 and the evaluation element 4 are distinguished from each other with an image recognition function of a transportation device.

It should be noted that the first circuit portions 3A and the second circuit portion 4A may have the same or substantially the same electrical circuit configuration and different physical configurations. Also in this case, non-defective products and defective products of the plurality of surface acoustic wave devices 3 are able to be sorted as long as there is a correlation between the electrical characteristics of the respective surface acoustic wave devices 3 and the electrical characteristics of the evaluation element 4.

In the present preferred embodiment, the first circuit portions 3A and the second circuit portion 4A preferably have the same or substantially the same electrical circuit configuration and physical configuration. It should be noted that the first circuit portions 3A and the second circuit portion 4A may have different electrical circuit configurations and physical configurations as long as pass bands of the respective surface acoustic wave devices 3 and a pass band of the evaluation element 4 are the same or substantially the same.

Alternatively, the first circuit portions 3A and the second circuit portion 4A may have different electrical circuit configurations and physical configurations as long as there is a correlation between the electrical characteristics of the respective surface acoustic wave devices 3 and the electrical characteristics of the evaluation element 4.

In the present preferred embodiment, as described above, the respective surface acoustic wave devices 3 and the evaluation element 4 are preferably band pass filters. Therefore, examination on the filter characteristics is performed in order to sort the non-defective products of the surface acoustic wave devices 3. It should be noted that the respective surface acoustic wave devices 3 and the evaluation element 4 are not limited to the band pass filters and may be, for example, resonators or other suitable devices. In this case, it is sufficient that, for example, impedance characteristics or other suitable characteristics are examined.

Although the functional electrodes 14 of the evaluation element 4 are preferably the IDT electrodes in the present preferred embodiment, the functional electrodes 14 may not be the IDT electrodes as long as there is a correlation between the electrical characteristics of the evaluation element 4 and the electrical characteristics of the respective surface acoustic wave devices 3. That is to say, the evaluation element 4 may not necessarily be the surface acoustic wave device.

Figure 7:
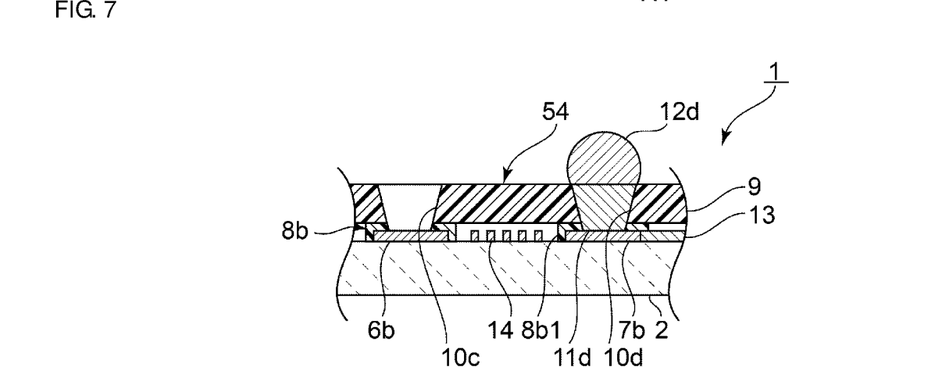
FIG. 7 is a front cross-sectional view of an evaluation element according to a variation of the first preferred embodiment of the present invention.

As in a variation illustrated in FIG. 7, preferably, no third under-bump metal layer may be provided in an evaluation element 54. No third bump is also provided in the evaluation element 54 because no third under-bump metal layer is provided therein. Also in this case, non-defective products and defective products of the plurality of surface acoustic wave devices are able to be sorted by examining the electrical characteristics of the evaluation element 54, and the plurality of surface acoustic wave devices and the evaluation element 54 are able to be easily distinguished from each other when seen from the above. Also with the configuration in which the third under-bump metal layers are provided in the third through-holes and no third bump is provided, the same or substantially the same effects as those obtained in the first preferred embodiment are obtained.

Figure 8:
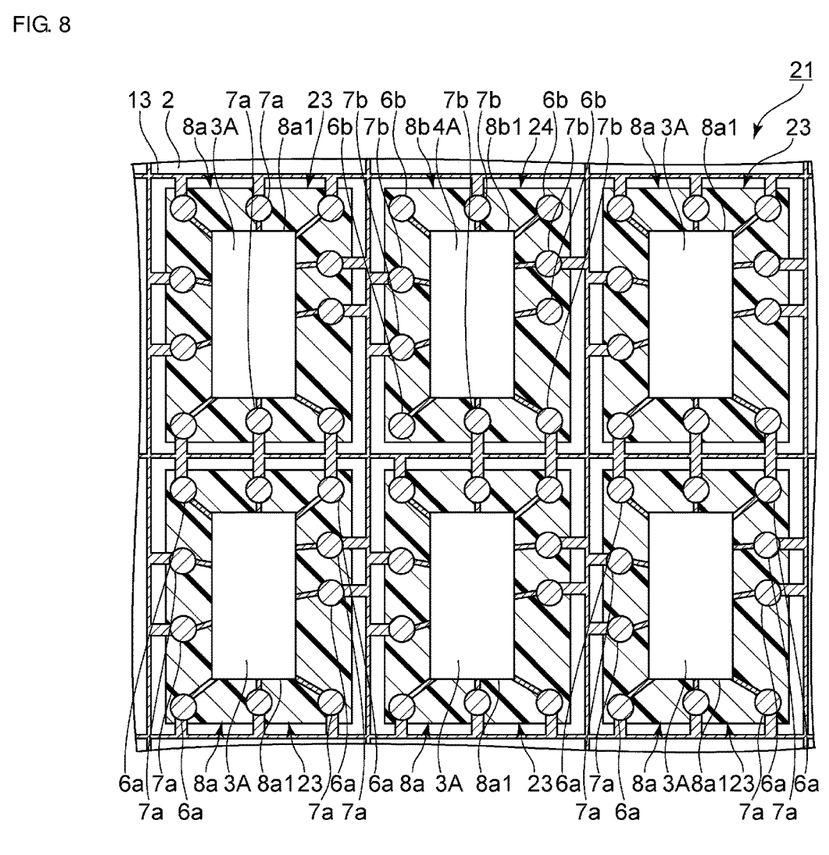
FIG. 8 is a partial plan cross-sectional view of a surface acoustic wave device assembly according to a second preferred embodiment of the present invention.
Figure 9:
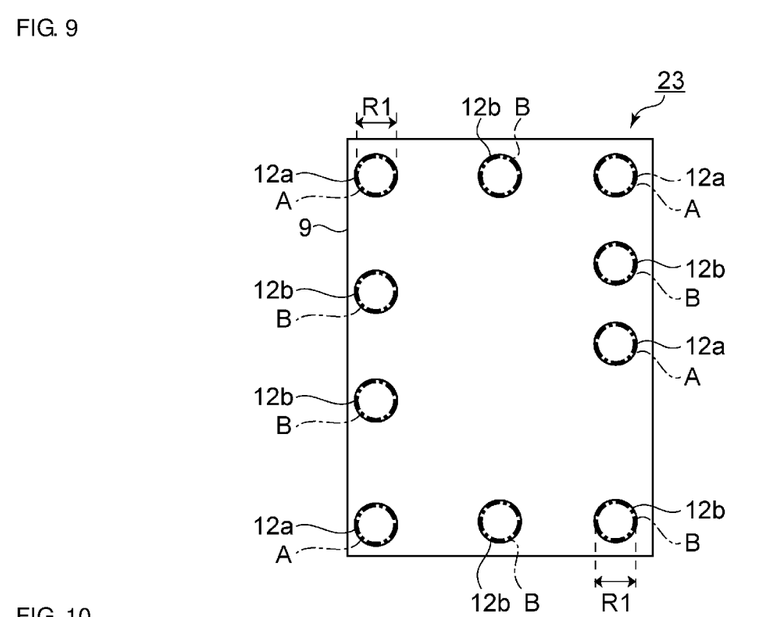
FIG. 9 is a plan view of a surface acoustic wave device in the second preferred embodiment of the present invention.
Figure 10:
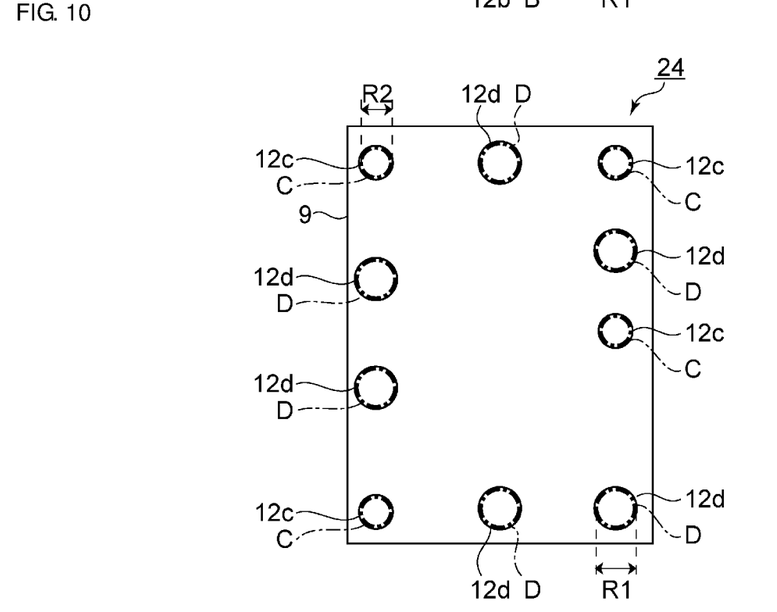
FIG. 10 is a plan view of an evaluation element in the second preferred embodiment of the present invention.

FIG. 8 is a partial plan cross-sectional view of a surface acoustic wave device assembly according to a second preferred embodiment of the present invention. FIG. 9 is a plan view of a surface acoustic wave device in the second preferred embodiment. FIG. 10 is a plan view of an evaluation element in the second preferred embodiment.

The second preferred embodiment is different from the first preferred embodiment in that more ground terminals than hot terminals are provided. To be more specific, more of the second ground terminals 7b than the second hot terminals 6b are preferably provided in an evaluation element 24 in a surface acoustic wave device assembly 21. Therefore, more of the fourth bumps 12d that are electrically connected to the second ground terminals 7b are provided than the third bumps 12c that are electrically connected to the second hot terminals 6b. More of the first ground terminals 7a than the first hot terminals 6a are preferably provided in a plurality of surface acoustic wave devices 23. Therefore, more of the second bumps 12b that are electrically connected to the first ground terminals 7a are provided than the first bumps 12a that are electrically connected to the first hot terminals 6a.

As illustrated in FIG. 4, the third bumps 12c largely enter the third through-holes 10c. Therefore, each of the thicknesses of the third bumps 12c in the direction toward outer side portions of the third through-holes 10c with reference to the main surface of the lid 9 at the opposite side to the side of the second support member 8b is preferably smaller than each of the above-described thicknesses of the fourth bumps 12d. The thicknesses of the first and second bumps 12a and 12b in the direction toward outer side portions of the first through-holes 10a with reference to the main surface of the lid 9 at the opposite side to the side of the first support members 8a, which are illustrated in FIG. 3, and the above-described thicknesses of the fourth bumps 12d are the same or substantially the same.

Figure 11:
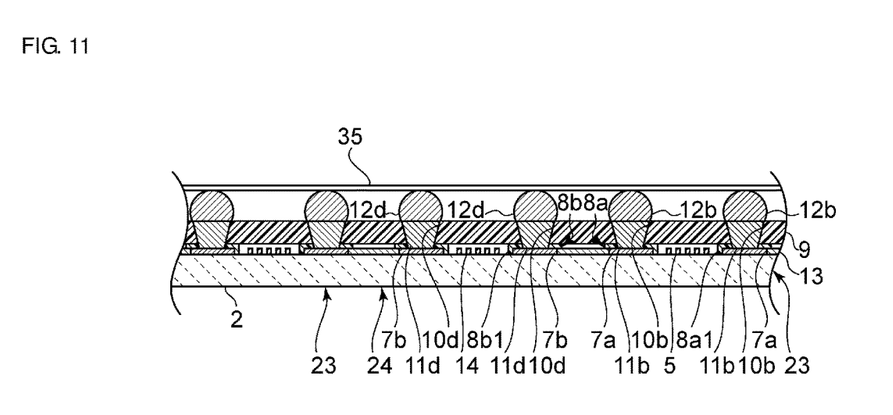
FIG. 11 is a view illustrating a state in which the surface acoustic wave device assembly is fixed with a tape in a process of grinding the rear surface of a collective board that is used in the surface acoustic wave device assembly in the second preferred embodiment of the present invention.

FIG. 11 is a view illustrating a state in which the surface acoustic wave device assembly is fixed with a tape in a process of grinding the rear surface of the collective board that is used in the surface acoustic wave device assembly in the second preferred embodiment of the present invention.

The second and fourth bumps 12b and 12d and the first bumps (not illustrated) are bonded to a tape 35. With this bonding, the surface acoustic wave device assembly 21 is fixed. In the present preferred embodiment, more of fourth bumps 12d having the above-described thicknesses that are the same or substantially the same as the above-described thicknesses of the first bumps and the second bumps 12b are preferably provided than the third bumps. Therefore, portions that are bonded to the tape 35 at the same or substantially the same height are able to be increased. A posture when the collective board 2 is ground is therefore stabilized.

The collective board 2 on which, for example, the first to fourth bumps 12a to 12d have been provided is half-cut from the main surface thereof on which the first and second ground terminals 7a and 7b and the first and second hot terminals 6a and 6b are provided. Thereafter, the main surface of the collective board 2, which opposes the above-described main surface, is ground, so that the collective board 2 is divided into individual piezoelectric substrates. With this process, the surface acoustic wave device assembly 21 is divided into the individual piezoelectric substrates 23. As described above, in the present preferred embodiment, the posture when the collective board 2 is ground is therefore stabilized. Therefore, the flatness of the divided piezoelectric substrates is effectively improved and variations in the thickness among the piezoelectric substrates are effectively reduced effectively.

The surface acoustic wave device assembly 21 may be divided into the individual piezoelectric substrates 23 by full-cutting the collective board 2 from the main surface thereof on which the first and second ground terminals 7a and 7b and the first and second hot terminals 6a and 6b are provided. In this case, the variations in the thickness among the divided piezoelectric substrates due to the grinding is not generated because the process of grinding the collective board 2 from the main surface of the collective board 2, which opposes the above-mentioned main surface, is not performed.

Next, a method for manufacturing a surface acoustic wave device assembly according to a third preferred embodiment of the present invention is described below.

FIGS. 12A to 12E are views to explain the method for manufacturing the surface acoustic wave device assembly according to the third preferred embodiment of the present invention. FIGS. 13A to 13D are views to explain the method for manufacturing the surface acoustic wave device assembly according to the third preferred embodiment of the present invention. FIGS. 14A to 14C are views to explain the method for manufacturing the surface acoustic wave device assembly according to the third preferred embodiment of the present invention. FIGS. 12A to 12E and FIGS. 13A to 13D illustrate the method for manufacturing one surface acoustic wave device of the plurality of surface acoustic wave devices and an evaluation element in the surface acoustic wave device assembly.

Figure 12A:
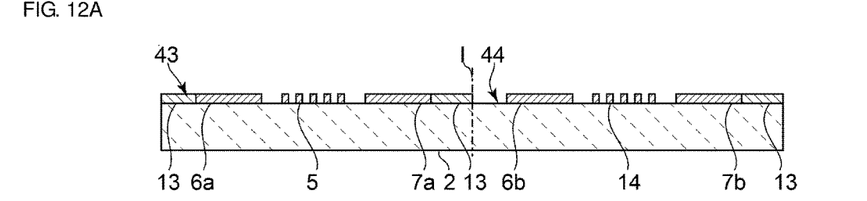
FIGS. 12A to 12E are views to explain a method for manufacturing a surface acoustic wave device assembly according to a third preferred embodiment of the present invention.

As illustrated in FIG. 12A, the collective board 2 is prepared. Then, the IDT electrodes 5, the functional electrodes 14, the first and second hot terminals 6a and 6b, the first and second ground terminals 7a and 7b, and the power supply wiring 13 are provided on the collective board 2. The first hot terminals 6a and the first ground terminals 7a are connected to the IDT electrodes 5. The second hot terminals 6b and the second ground terminals 7b are connected to the functional electrodes 14.

The first and second hot terminals 6a and 6b are arranged such that positions of the first hot terminals 6a in surface acoustic wave devices 43 and positions of the second hot terminals 6b in an evaluation element 44 are the same or substantially the same. The first and second ground terminals 7a and 7b are arranged such that positions of the first ground terminals 7a in the surface acoustic wave devices 43 and positions of the second ground terminals 7b in the evaluation element 44 are the same or substantially the same. With this arrangement, the manufacturing process is simplified.

The power supply wiring 13 is arranged along dicing lines along which the collective board is divided in a subsequent process. The power supply wiring 13 is connected to the first hot terminals 6a and the first and second ground terminals 7a and 7b and so as not to be connected to the second hot terminals 6b.

The IDT electrodes 5, the functional electrodes 14, the first and second hot terminals 6a and 6b, the first and second ground terminals 7a and 7b, and the power supply wiring 13 may preferably be formed by, for example, a chemical vapor deposition (CVD) method, a sputtering method, or other suitable method.

Figure 12B:
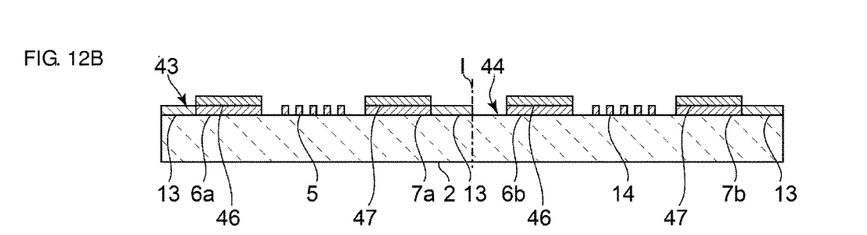

Subsequently, as illustrated in FIG. 12B, wirings 46 and 47 as second electrode layers are provided on the first and second hot terminals 6a and 6b and the first and second ground terminals 7a and 7b, respectively. The wirings 46 and 47 may preferably be formed by, for example, the CVD method, the sputtering method, or other suitable method. It should be noted that the wirings 46 and 47 may not necessarily be formed. The formation of the wirings 46 and 47 is able to reduce electric resistance in the first and second hot terminals 6a and 6b and the first and second ground terminals 7a and 7b. For this reason, it is preferable that the wirings 46 and 47 be provided.

Figure 12C:
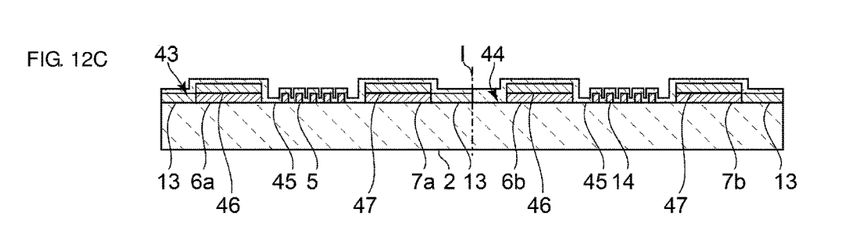

Then, as illustrated in FIG. 12C, a protection film 45 is provided on the collective board 2 so as to cover the IDT electrodes 5 and the functional electrodes 14. The protection film 45 is preferably formed by a dielectric, such as $SiO_2$, for example. The protection film 45 may preferably be formed by, for example, the CVD method or other suitable method. It should be noted that the protection film 45 may not necessarily be provided. The protection film 45 makes the IDT electrodes 5 and the functional electrodes 14 more difficult to be damaged. For this reason, it is preferable that the protection film 45 be provided.

Figure 12D:
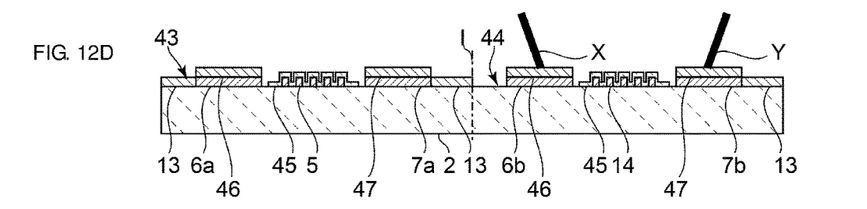

Thereafter, as illustrated in FIG. 12D, electric characteristics of the evaluation element 44 are examined. A portion of the protection film 45 is removed such that an exposure portions in which at least portions of the first and second hot terminals 6a and 6b and the first and second ground terminals 7a and 7b are exposed are formed. Examination is performed by making a probe X and a probe Y of an examination device contact the wiring 46 on the second hot terminal 6b and the wiring 47 on the second ground terminal 7b in the exposure portions. With this examination, non-defective products and defective products of the plurality of surface acoustic wave devices 43 are able to be sorted before the division into the individual surface acoustic wave devices 43. Accordingly, only the plurality of surface acoustic wave devices 43 on the collective board 2 on which the evaluation element 44 that has been determined to satisfy desired characteristics with the above-described examination is provided are able be subject to subsequent processes, so as to reduce the cost.

Figure 12E:
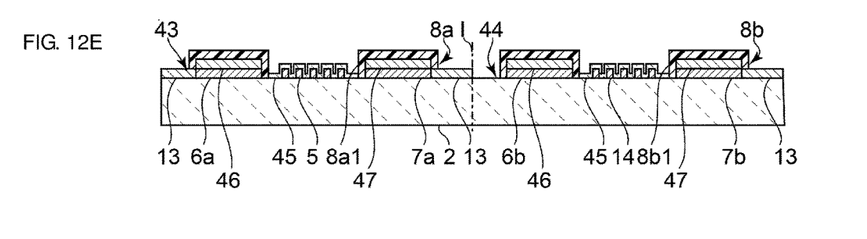

Then, as illustrated in FIG. 12E, the first support members 8a are provided on the collective board 2 so as to cover the first hot terminals 6a and the first ground terminals 7a and surround the IDT electrodes 5. The second support member 8b is provided on the collective board 2 so as to cover the second hot terminals 6b and the second ground terminals 7b and surround the functional electrodes 14. The first and second support members 8a and 8b are provided such that the planar shapes of the first cavities 8a1 of the first support members 8a to which the IDT electrodes 5 are exposed and the planar shape of the second cavity 8b1 of the second support member 8b to which the functional electrodes 14 are exposed are the same or substantially the same. With this arrangement, the manufacturing process is simplified. It should be noted that the planar shapes of the first cavities 8a1 and the planar shape of the second cavity 8b1 may not be the same or substantially the same.

The first and second support members 8a and 8b may preferably be provided by, for example, a photolithography method.

Figure 13A:
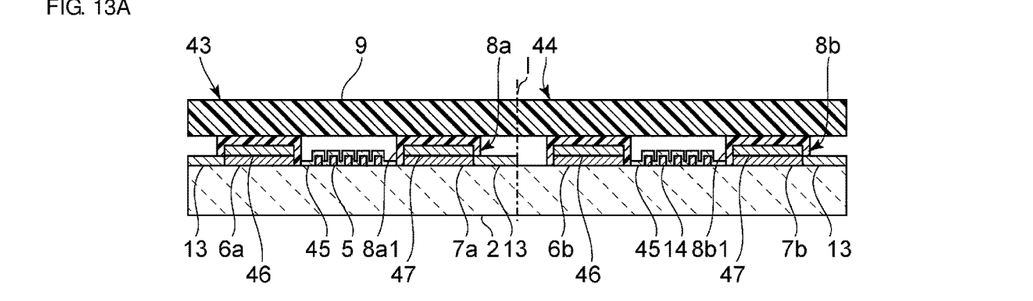
FIGS. 13A to 13D are views to explain the method for manufacturing the surface acoustic wave device assembly in the third preferred embodiment of the present invention.
Figure 14A:
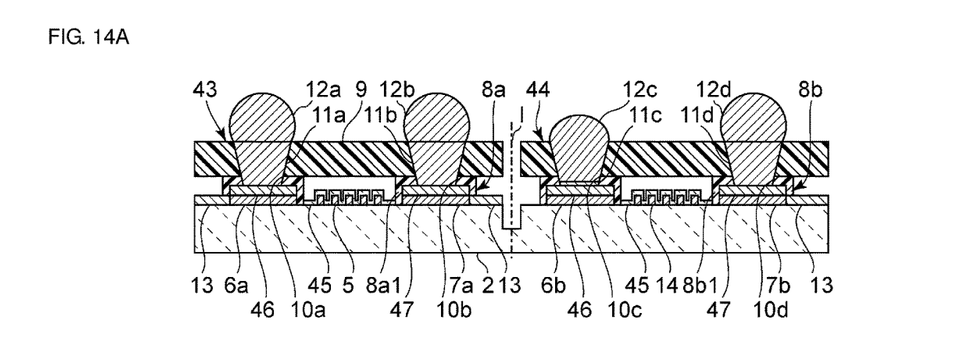
FIGS. 14A to 14C are views to explain the method for manufacturing the surface acoustic wave device assembly in the third preferred embodiment of the present invention.
Figure 14B:
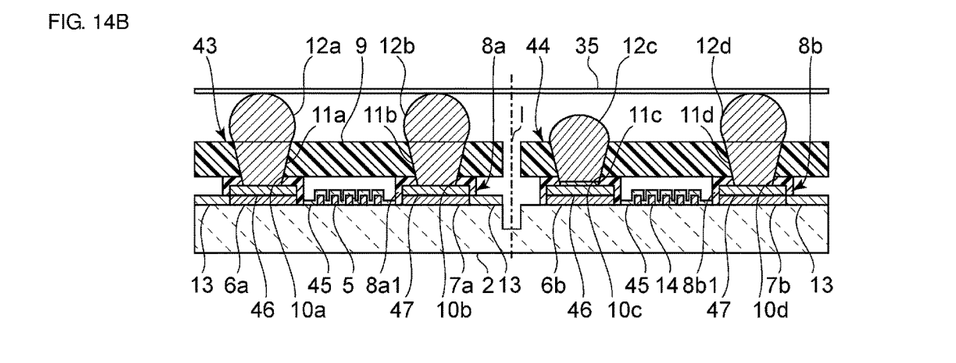
Figure 14C:
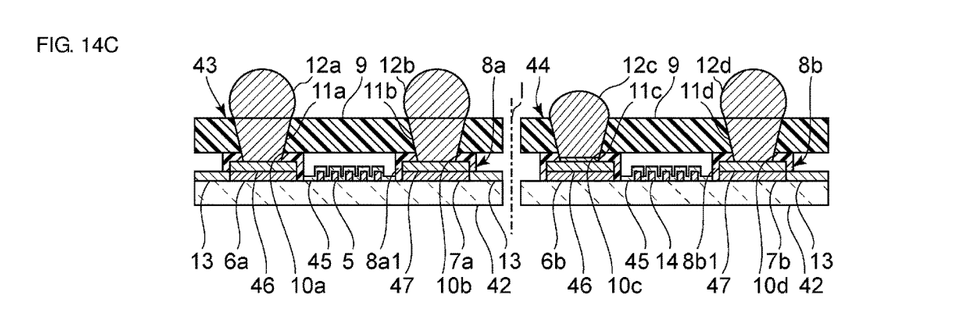

Next, as illustrated in FIG. 13A, the lid 9 is provided so as to seal the first cavities 8a1 of the first support members 8a and the second cavity 8b1 of the second support member 8b.

Figure 13B:
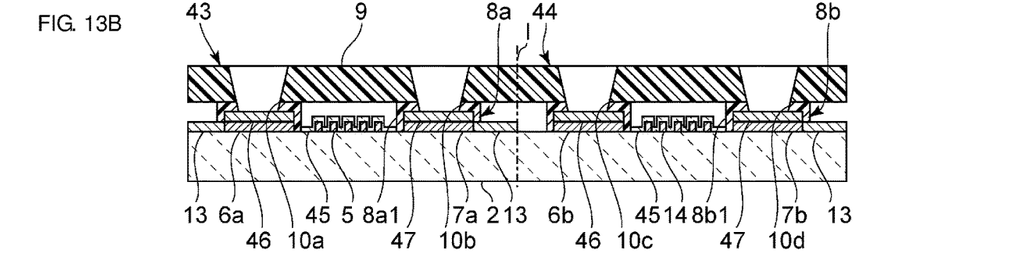

Subsequently, as illustrated in FIG. 13B, the first through-holes 10a pass through the lid 9 and the first support members 8a and extend to the wirings 46 on the first hot terminals 6a. The second through-holes 10b pass through the lid 9 and the first support members 8a and extend to the wirings 47 on the first ground terminals 7a. The third through-holes 10c pass through the lid 9 and the second support member 8b and extend to the wirings 46 on the second hot terminals 6b. The fourth through-holes 10d pass through the lid 9 and the second support member 8b and extend to the wirings 47 on the second ground terminals 7b.

As described above, the first and second hot terminals 6a and 6b are preferably provided such that the positions of the first hot terminals 6a in the surface acoustic wave devices 43 and the positions of the second hot terminals 6b in the evaluation element 44 are the same or substantially the same. Therefore, the first and third through-holes 10a and 10c are provided such that arrangement of the first through-holes 10a in the first support members 8a and arrangement of the third through-holes 10c in the second support member 8b are the same or substantially the same. The first and second ground terminals 7a and 7b are preferably provided such that the positions of the first ground terminals 7a in the first circuit portions and the positions of the second ground terminals 7b in the second circuit portion are the same or substantially the same or substantially the same. Therefore, the second and fourth through-holes 10b and 10d are provided such that arrangement of the second through-holes 10b in the first support members 8a and arrangement of the fourth through-holes 10d in the second support member 8b are the same or substantially the same. With this arrangement, the manufacturing process is simplified.

Figure 13C:
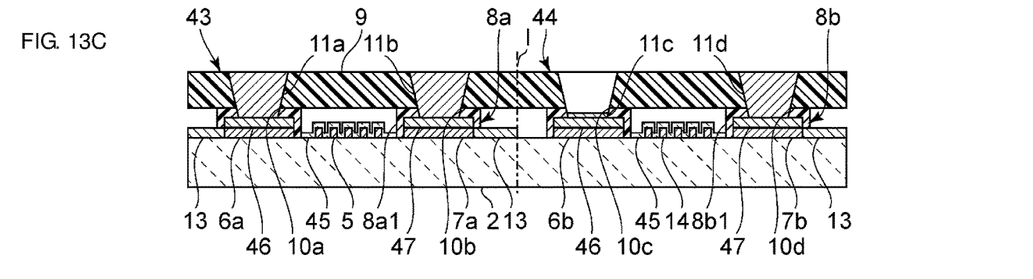

Subsequently, as illustrated in FIG. 13C, the first to fourth under-bump metal layers 11a to 11d are provided in the first to forth through-holes 10a to 10d, respectively. The first, second, and fourth under-bump metal layers 11a, 11b, and 11d may preferably be formed by, for example, the electrolytic plating method using the power supply wiring 13 connected to the first hot terminals 6a and the first and second ground terminals 7a and 7b. By contrast, the second hot terminals 6b are not connected to the power supply wiring 13. Therefore, the third under-bump metal layers 11c are not formed by the electrolytic plating method directly using the power supply wiring 13. A leakage current is generated when the first, second, and fourth under-bump metal layers 11a, 11b, and 11d are formed. The leakage current causes the wirings 46 on the second hot terminals 6b, which are exposed by the third through-holes 10c, to be electroplated and the third under-bump metal layers 11c are thus formed. It should be noted that the third under-bump metal layers 11c may not be provided. Therefore, a configuration or a manufacturing method with which the above-described leakage current is unlikely to be generated may be utilized.

Figure 13D:
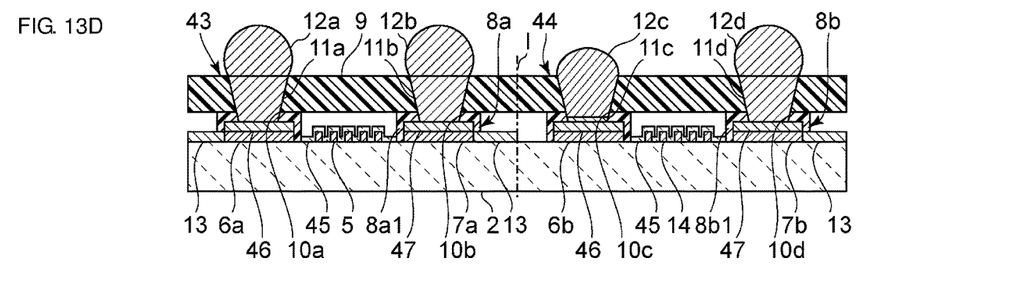

Then, as illustrated in FIG. 13D, the first to fourth bumps 12a to 12d are provided on the first to fourth under-bump metal layers 11a to 11d, respectively. It should be noted that the third bumps 12c may not be provided. Therefore, the usage amount of the brazing filler metal that is used to form the bumps is able to be reduced. The manufacturing process is simplified by providing the first to fourth bumps under the same conditions as in the present preferred embodiment.

Subsequently, as illustrated in FIG. 14A, the collective board 2 is half-cut along the dicing lines 1 from the main surface thereof on which the first and second ground terminals 7a and 7b and the first and second hot terminals 6a and 6b are provided. Then, as illustrated in FIG. 14B, the surface acoustic wave device assembly is fixed to the tape 35. To be more specific, the first, second, and fourth bumps 12a, 12b, and 12d are bonded to the tape 35.

Thereafter, the main surface of the collective board 2, which opposes the above-described main surface, is ground. With this grinding, as illustrated in FIG. 14C, the collective board 2 illustrated in FIG. 14B is divided into individual piezoelectric substrates 42 and is divided into the individual surface acoustic wave devices 43 and the evaluation element 44.

A larger number of second ground terminals 7b, fourth under-bump metal layers 11d, and fourth bumps 12d than the second hot terminals 6b, the third under-bump metal layers 11c, and the third bumps 12c are arranged, so as to increase portions supporting the tape 35. A posture when the collective board 2 is ground is able to be therefore stabilized. Accordingly, flatness of the individual piezoelectric substrates 42 is effectively improved and variations in the thickness are effectively reduced.

The collective board 2 may be full-cut from the main surface thereof on which the first and second ground terminals 7a and 7b and the first and second hot terminals 6a and 6b are provided in the division into the individual surface acoustic wave devices 43.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device assembly comprising:
   a collective board including a piezoelectric body;
   a plurality of first circuit portions provided on the collective board and respectively including IDT electrodes, and first hot terminals and first ground terminals connected to the IDT electrodes;
   a second circuit portion provided on the collective board and including a functional electrode, and a second hot terminal and a second ground terminal connected to the functional electrode; and
   a power supply wiring provided on the collective board so as to surround a periphery of the plurality of first circuit portions and the second circuit portion; wherein
   the plurality of first circuit portions define surface acoustic wave devices as band pass filters and the second circuit portion define a band pass filter;
   the plurality of first ground terminals and the plurality of first hot terminals are connected to the power supply wiring, the second ground terminal is connected to the power supply wiring, and the second hot terminal is not connected to the power supply wiring; and
   pass bands of the surface acoustic wave devices and a pass band of the band pass filter defined by the second circuit portion are the same or substantially the same.

2. The surface acoustic wave device assembly according to claim 1, further including:
   a plurality of first support members provided on the collective board and respectively including first cavities to which the respective first circuit portions are exposed;
   a second support member provided on the collective board and including a second cavity to which the second circuit portion is exposed; and
   a lid that is provided on the plurality of first support members and the second support member so as to seal the plurality of first cavities and the second cavity; wherein
   the plurality of first support members overlap with the plurality of first hot terminals and the plurality of first ground terminals when seen from above, and the second support member overlaps with the second hot terminal and the second ground terminal; and
   a plurality of first through-holes and a plurality of second through-holes pass through the plurality of first support members and the lid and expose the plurality of first hot terminals and the plurality of first ground terminals, and a third through-hole and a fourth through-hole pass through the second support member and the lid and expose the second hot terminal and the second ground terminal.

3. The surface acoustic wave device assembly according to claim 2, further including:
   first under-bump metal layers that are respectively provided in the plurality of first through-holes;
   second under-bump metal layers that are respectively provided in the plurality of second through-holes; and a fourth under-bump metal layer that is provided in the fourth through-hole.

4. The surface acoustic wave device assembly according to claim 3, wherein no under-bump metal layer is provided in the third through-hole.

5. The surface acoustic wave device assembly according to claim 3, further comprising:
a third under-bump metal layer that is provided in the third through-hole; wherein
thicknesses of the respective first under-bump metal layers are larger than a thickness of the third under-bump metal layer.

6. The surface acoustic wave device assembly according to claim 5, further comprising:
a plurality of first bumps that are provided on the respective first under-bump metal layers;
a plurality of second bumps that are provided on the respective second under-bump metal layers;
a third bump that is provided at a position overlapping with the third through-hole when seen from above; and
a fourth bump that is provided on the fourth under-bump metal layer; wherein
diameters of inscribed circles that are inscribed in the plurality of first bumps are larger than a diameter of an inscribed circle that is inscribed in the third bump when seen from above.

7. The surface acoustic wave device assembly according to claim 2, wherein planar shapes of the plurality of first cavities of the respective first support members and a planar shape of the second cavity of the second support member are the same or substantially the same.

8. The surface acoustic wave device assembly according to claim 2, wherein a larger number of the second ground terminals than the second hot terminal are provided.

9. The surface acoustic wave device assembly according to claim 2, wherein an arrangement of the first and second through-holes in the respective first support members and an arrangement of the third and fourth through-holes in the second support member are the same or substantially the same.

10. The surface acoustic wave device assembly according to claim 1, wherein the functional electrode of the second circuit portion is an IDT electrode having the same or substantially the same configuration as the IDT electrodes of the plurality of first circuit portions, and the plurality of first circuit portions and the second circuit portion have the same or substantially the same electric circuit configuration and physical configuration.

11. The surface acoustic wave device assembly according to claim 1, wherein the functional electrode of the second circuit portion is an IDT electrode having the same or substantially the same configuration as the IDT electrodes of the plurality of first circuit portions, and the plurality of first circuit portions and the second circuit portion have the same or substantially the same electric circuit configuration and physical configuration.

12. A surface acoustic wave device assembly comprising:
a collective board including a piezoelectric body;
a plurality of first circuit portions provided on the collective board and respectively including IDT electrodes, and first hot terminals and first ground terminals connected to the IDT electrodes;
a second circuit portion provided on the collective board and including a functional electrode, and a second hot terminal and a second ground terminal connected to the functional electrode; and
a power supply wiring provided on the collective board so as to surround a periphery of the plurality of first circuit portions and the second circuit portion; wherein
the plurality of first circuit portions define surface acoustic wave devices;
the plurality of first ground terminals and the plurality of first hot terminals are connected to the power supply wiring, the second ground terminal is connected to the power supply wiring, and the second hot terminal is not connected to the power supply wiring; and
electric circuit configurations of the plurality of first circuit portions and an electric circuit configuration of the second circuit portion are the same or substantially the same.

13. The surface acoustic wave device assembly according to claim 12, further including:
a plurality of first support members provided on the collective board and respectively including first cavities to which the respective first circuit portions are exposed;
a second support member provided on the collective board and including a second cavity to which the second circuit portion is exposed; and
a lid that is provided on the plurality of first support members and the second support member so as to seal the plurality of first cavities and the second cavity; wherein
the plurality of first support members overlap with the plurality of first hot terminals and the plurality of first ground terminals when seen from above, and the second support member overlaps with the second hot terminal and the second ground terminal; and
a plurality of first through-holes and a plurality of second through-holes are provided so as to pass through the plurality of first support members and the lid and expose the plurality of first hot terminals and the plurality of first ground terminals, and a third through-hole and a fourth through-hole pass through the second support member and the lid and expose the second hot terminal and the second ground terminal.

14. The surface acoustic wave device assembly according to claim 13, further including:
first under-bump metal layers that are respectively provided in the plurality of first through-holes;
second under-bump metal layers that are respectively provided in the plurality of second through-holes; and
a fourth under-bump metal layer that is provided in the fourth through-hole.

15. The surface acoustic wave device assembly according to claim 14, wherein no under-bump metal layer is provided in the third through-hole.

16. The surface acoustic wave device assembly according to claim 14, further comprising:
a third under-bump metal layer that is provided in the third through-hole; wherein
thicknesses of the respective first under-bump metal layers are larger than a thickness of the third under-bump metal layer.

17. The surface acoustic wave device assembly according to claim 16, further comprising:
a plurality of first bumps that are provided on the respective first under-bump metal layers;
a plurality of second bumps that are provided on the respective second under-bump metal layers;
a third bump that is provided at a position overlapping with the third through-hole when seen from above; and a fourth bump that is provided on the fourth under-bump metal layer; wherein diameters of inscribed circles that are inscribed in the plurality of first bumps are larger than a diameter of an inscribed circle that is inscribed in the third bump when seen from above.

18. The surface acoustic wave device assembly according to claim 13, wherein planar shapes of the plurality of first cavities of the respective first support members and a planar shape of the second cavity of the second support member are the same or substantially the same.

19. The surface acoustic wave device assembly according to claim 13, wherein a larger number of the second ground terminals than the second hot terminal are provided.

20. The surface acoustic wave device assembly according to claim 13, wherein an arrangement of the first and second through-holes in the respective first support members and an arrangement of the third and fourth through-holes in the second support member are the same or substantially the same.

* * * * *